United States Patent
Rose

[11] Patent Number: 5,935,497
[45] Date of Patent: Aug. 10, 1999

[54] METHOD OF PRINTING A GRAPHIC ON A MEMORY CARD

[75] Inventor: René Rose, Voisin-le-Bretonneux, France

[73] Assignee: Schlumberger Industries, Montrouge, France

[21] Appl. No.: 08/665,977

[22] Filed: Jun. 19, 1996

[30] Foreign Application Priority Data

Jun. 21, 1995 [FR] France .................................. 95 07545

[51] Int. Cl.⁶ ........................... B29C 45/14; B29C 45/16; B29C 70/70
[52] U.S. Cl. .................... 264/132; 264/261; 264/272.15; 264/272.17; 264/275
[58] Field of Search .................... 264/259, 511, 264/261, 263, 275, 278, 294, 328.7, 328.8, 271.1, 272.15, 272.17, 132; 425/129.1, 121

[56] References Cited

U.S. PATENT DOCUMENTS

| | | | |
|---|---|---|---|
| 4,961,893 | 10/1990 | Rose | 264/261 |
| 5,030,309 | 7/1991 | Brignet et al. | |
| 5,030,407 | 7/1991 | Mollet et al. | 264/261 |
| 5,164,144 | 11/1992 | Rose | 264/271.1 |
| 5,510,074 | 4/1996 | Rose | 264/272.17 |

FOREIGN PATENT DOCUMENTS

| | | |
|---|---|---|
| A-0267826 | 5/1988 | European Pat. Off. |
| A-0277854 | 8/1988 | European Pat. Off. |
| A-2644630 | 9/1990 | France |
| A-2702067 | 9/1994 | France |
| 61-14923 | 1/1986 | Japan |
| 61-222712 | 10/1986 | Japan |
| WO-A-9220506 | 11/1992 | WIPO |

*Primary Examiner*—Angela Ortiz
*Attorney, Agent, or Firm*—Frishauf, Holtz, Goodman, Langer & Chick

[57] ABSTRACT

A method of printing a graphic on an electronic memory card comprised of a card body, made of a thermoplastic material and having two main faces that are substantially mutually parallel, and an electronic module carrying electrical contacts on a contact face thereof, which contacts are connected to a semiconductor chip. The electronic memory card is molded by injecting the thermoplastic material in a molten state into a mold having a cavity defining the shape of the card body, and solidifying the molten material in the presence of the electronic module in the mold. The memory card is unmolded, and the graphic is then printed on the card body.

5 Claims, 4 Drawing Sheets

METHOD OF PRINTING A GRAPHIC ON A MEMORY CARD

BACKGROUND OF THE INVENTION

The present invention relates to a method of printing a graphic on an electronic memory card.

A particularly advantageous application of the invention lies in the field of memory cards of the type comprising a card body with an electronic module mounted on it. The card body has two main faces that are substantially parallel and of dimensions defined by the ISO 7810 standard. The electronic module comprises a support, generally in the form of a film, on which a semiconductor chip such as a microprocessor or an EEPROM is disposed, either directly on the surface of the film or else in a window previously cut out in the thickness of the support. On one face of the support, referred to as the "contact" face, and facing away from the semiconductor chip, electrical contacts are formed to which the semiconductor chip is connected, e.g. by means of connection wires that pass through holes formed in the film. These electrical contacts are intended to provide an electrical link to equipment, such as a card reader, with which the semiconductor chip is to exchange information.

For commercial reasons and for reasons to do with appearance, the main faces of the card body are decorated by means of a graphic, which is usually applied by the well-known technique of offset printing.

In practice, an electronic memory card having a printed graphic is made as follows. A card body is made in which a cavity is formed for receiving the electronic module. The cavity is of dimensions that are larger than those of the module, and it may be obtained by various different methods. For example, the card body is punched out from a laminated plastic sheet, and then machined to form the cavity. The card body can also be made by molding it in a mold recess that includes a projection which forms a space with a volume corresponding to the cavity. If the card body is laminated, a portion can be cut out from a half-card body to form the cavity. After formation of the cavity by one of these methods, the desired graphic is printed on at least one of the main faces of the card body. Finally, the electrical module is mounted in the cavity with an adhesive, and the semiconductor chip is programmed as a function of the intended application, such as pay-phone and bank transactions.

However, this known method of printing an electronic memory card suffers from several drawbacks.

Firstly, the card manufacturer must retain an inventory of printed card bodies, prepared as described above, into which the card manufacturer mounts the electronic module. However, it is difficult to know how many printed card bodies of any particular graphic to order because one cannot predict how many memory cards will be manufactured badly. More specifically, after the electronic module is mounted on the card body, the memory card is tested. It is rejected as unacceptable if the electronic module is glued badly or if the module fails to operate properly. In such a case, the printed card body must be discarded. Thus, to take such an eventuality into account, more printed card bodies must be inventoried then the number of memory cards being manufactured. However, the needed number of printed card bodies is difficult to predict when the printing is done prior to manufacture of the memory card by mounting the electronic module on the card body.

In addition, the stresses exerted on the card body during offset printing make it necessary to provide means for supporting the bottom of the cavity because it is so thin. Otherwise, the card body could be damaged or the graphic could be poorly printed.

Finally, even after printing, the bottom of the card body can still be seen through the empty spaces surrounding the electronic module, because of the gap that exists between the module and the periphery of the cavity. This detracts from the appearance of the memory card.

SUMMARY OF THE INVENTION

An object of the present invention is to provide an improved technique for manufacturing an electronic memory card having graphics printed thereon.

This and other objects are attained in accordance with one aspect of the invention by a method of printing a graphic on an electronic memory card. The card is comprised of a card body made of a thermoplastic material and having two main faces that are substantially mutually parallel, and an electronic module carrying electrical contacts on a contact face thereof, which contacts are connected to a semiconductor chip. The method comprises the steps of molding the electronic memory card by injecting the thermoplastic material in a molten state into a mold having a cavity defining the shape of the card body, and solidifying the molten material in the presence of the electronic module in the mold. The memory card is then unmolded. The graphic can be printed on at least the main face of the card body with which the electrical contacts are flush, including on the contact face of the electronic module with the exception of the electrical contacts themselves.

BRIEF DESCRIPTION OF THE DRAWINGS

FIG. 1b is a cross-section view on line 1—1 of the plan view of FIG. 1a.

DETAILED DESCRIPTION OF THE INVENTION

Figure 1B:
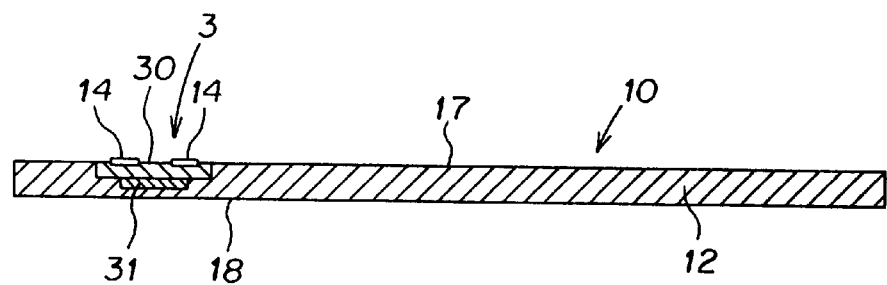
Figure 1A:
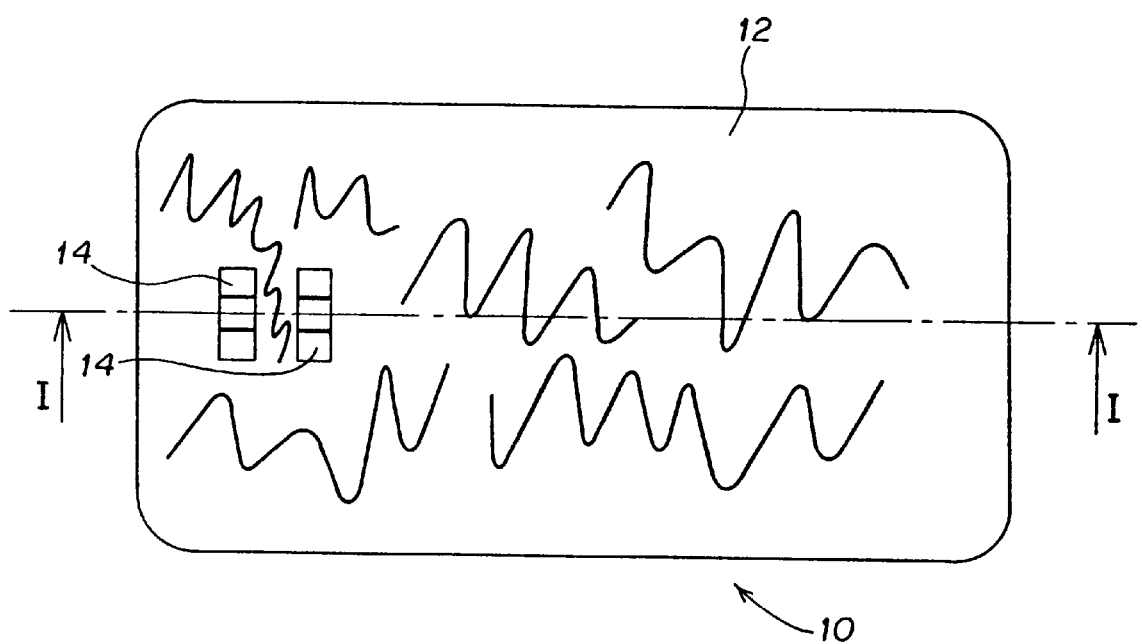
FIG. 1a is a plan view of an electronic memory card made by the method of the invention.

FIGS. 1a and 1b are, respectively, a plan view and a cross-section view of an electronic memory card 10 comprising a card body 12 that is generally in the form of a rectangular parallelepiped having two main faces 17 and 18 that are substantially mutually parallel. The card body 12 is made in accordance with the ISO 7810 standard and its dimensions are, therefore, 85 mm long, 54 mm wide, and 0.8 mm thick.

As shown in FIGS. 1a and 1b, the card 10 also has an electronic module 3 carrying electrical contacts 14 on a contact face 30 thereof, which contacts 14 are provided to establish an electrical connection between equipment associated with the card 10 and a semiconductor chip 31 so as to enable information to be interchanged concerning the service offered to the user when using the memory card 10. The electrical contacts 14 also comply with the above-mentioned ISO standard.

The electronic memory card 10 of FIGS. 1a and 1b is intended to receive on at least one of its main faces 17 and 18 a printed graphic which is applied using the printing method described below with reference to FIGS. 2 and 3a to 3c.

Figure 2:
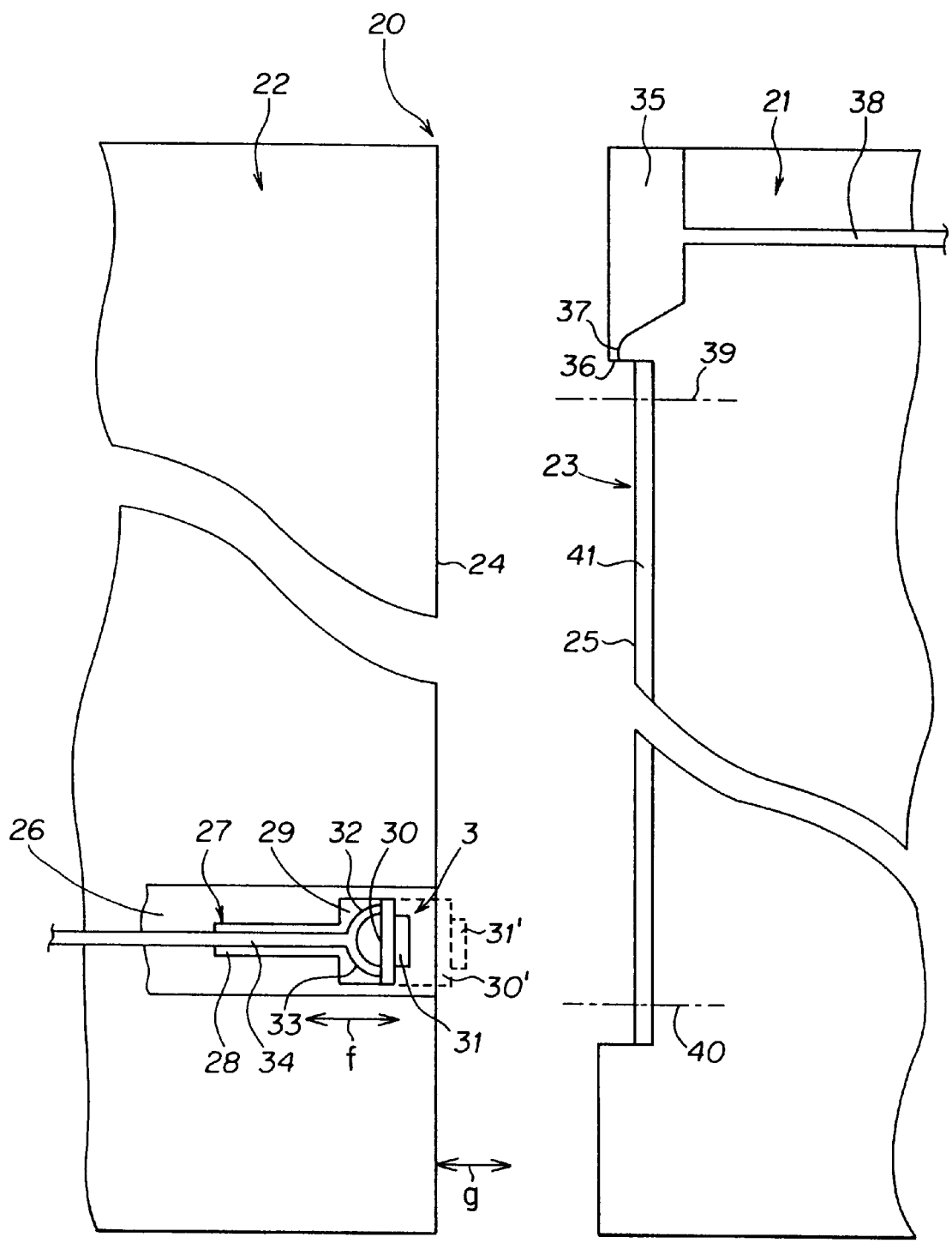
FIG. 2 is a cross-section view of apparatus for molding the electronic memory card shown in FIGS. 1a and 1b.

The card 10 is initially injection molded using a molten thermoplastic material in a mold which is shown in side view and in section in FIG. 2.

The molding apparatus 20 comprises a fixed portion 21 and a moving portion 22. The moving portion is suitable for occupying a position in which it is close to and pressed against the fixed portion 21. In this closed position of the mold, the fixed and moving portions together define a mold recess 23 that is generally rectangular in shape and which corresponds to the shape of the memory card to be made.

The main wall 24 of the moving portion 22, and the main wall 25 of the fixed portion 21 correspond respectively to the front and back main faces 17 and 18 respectively of the card 10.

Once the mold has been closed, i.e. once the moving portion 22 has been pressed against the fixed portion 21, the distance between the main walls 24 and 25 corresponds to the thickness of the card (0.8 mm in the ISO standard). Also, the recess 23 is of a length and a width that correspond to the ISO standard. Because the thermoplastic shrinks, the dimension of the recess are slightly greater than those of the standard.

A cavity 26 is provided in the moving portion 22 of the mold 20 and it opens out into the main wall 24 thus communicating, when the mold is in its closed position, with the mold recess 23. The cavity 26 is generally cylindrical in shape having a substantially square cross-section perpendicular to its longitudinal axis, and moving equipment 27 is provided inside the cavity suitable for moving in translation along the longitudinal axis of the cylindrical cavity 26. The moving equipment 27 includes a piston 28 connected to means such as a hydraulic actuator that are known per se and not shown, and a carrier 29 which is fixed to the end of the piston 28 adjacent to the orifice of the cavity 26 that opens out in the main wall 24. The electronic module 3 that includes a contact face 30 and a semiconductor chip 31 is suitable for being placed on the carrier 29 and for being held thereby.

The electronic module 3 is held pressed against the carrier 29 by a suction effect, implemented via ducts 32 and 33 opening out through the top face of the carrier 29 and connected at their ends remote from the electronic module 3 to a main suction duct 34 which is itself connected to suction means (not shown, but known per se). The respective dimensions of the carrier 29 and of the contact face 30 ensure that the front face of the carrier 29 is substantially totally covered by the contact face 30 which is held parallel to the main wall 24.

The carrier 29 has a dimension extending transversely to the longitudinal axis of the cavity 26 that is substantially equivalent to the inside dimensions of the cavity 26 and, more particularly, that it is very slightly smaller.

As shown in FIG. 3, the fixed portion 21 of the mold 20 includes an injection chamber 35 disposed laterally relative to the recess 23 and communicating therewith via an opening 36 that is generally in the form of a rectangle and which opens out into a face of the recess 23 that extends transversely to the main wall 25 of said recess. The injection chamber 35 includes a narrowed portion 37 of thickness close to that of the opening 36. The injection chamber 35 is connected to a source of thermoplastic material subjected to temperature and pressure. It is connected via an injection channel 38.

Figure 3C:
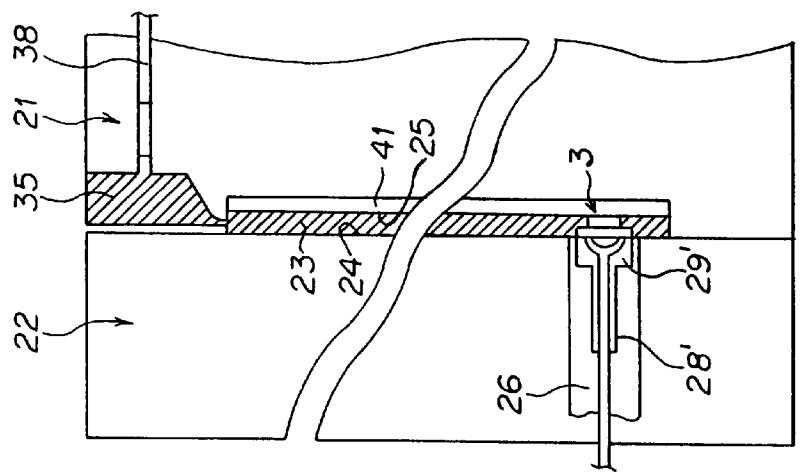
FIGS. 3a, 3b, and 3c are views of the FIG. 2 molding apparatus for three respective positions of the mold and the electronic module during manufacture of the electronic memory card of FIGS. 1a and 1b.

The method of making the electronic card 10 is described below with reference to FIGS. 3a, 3b, and 3c, each showing a position of the moving portion 22 of the mold and of the piston 27 carrying the electronic module 3.

Figure 3B:
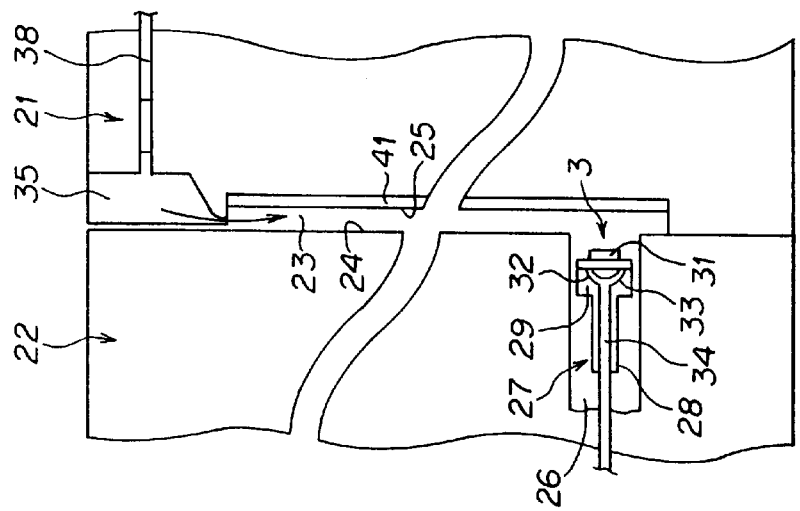
Figure 3A:
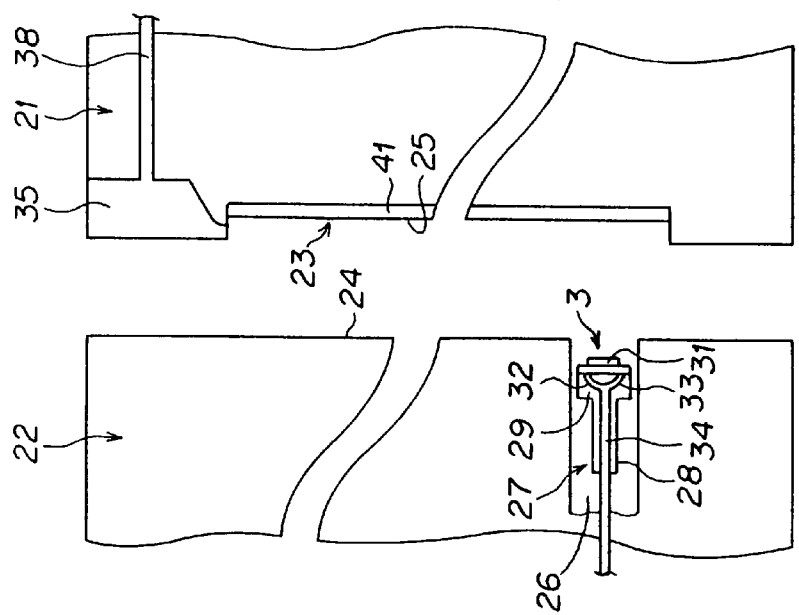

The first step is shown in FIG. 3a in which it can be seen that the moving portion 22 is in a position remote from the fixed portion 21, while the piston 28 carrying the electronic module 3 is likewise in a position that is retracted into the cavity 26. Thus, the electronic module 3 is disposed inside the cavity, and in any event it does not extend beyond the main wall 24 of the moving portion 22.

A plate 41 is placed flat against a wall of fixed portion 21 of the mold 20. One surface of plate 41 forms main wall 25 which defines recess 23, as explained above. This plate 41 is held in position by mechanical fixing means such as screws having axes that are represented in FIG. 2 by chain-dotted lines 39 and 40.

The plate 41 may include projections or indentations forming inscriptions that are to appear on the main face 18 of the card body 12. The inscriptions can constitute a logo, alphanumeric characters, or even characters that can be read by the visually handicapped. However, the plate 41 may naturally also be smooth without any marking if no embossed or indented inscription is to appear on the card body.

In a second step, as shown in FIG. 3b, the moving portion 22 of the mold is moved in translation so that the main wall 24 comes into abutment against the fixed portion 21 of the mold. In this way, the recess 23 defines a closed volume that is defined by the main walls 24 and 25, respectively. It should be observed that, in this position, the piston 28 carrying the electronic module 3 is still in its position retracted inside the cavity 26 provided in the moving portion 22.

Still in the position shown in FIG. 3b, a molten thermoplastic material under pressure is injected via the injection channel 38 and fills the injection chamber 35, and then passes via the narrow portion 37 and the opening 36 to flow into the volume defined by the recess 23. It should be observed that given the high pressure (about 800 bars to 1000 bars) to which the material is subjected, and given the small volume of the recess 23, the recess is filled with the thermoplastic material that is to constitute the card body 12 in a relatively short length of time, e.g. less than one second.

The electronic module 3 is preferably moved into recess 23 when the material has completely filled, or substantially completely filled, the recess 23. More specifically, the actuator 28 is displaced so as to cause it to occupy position 28' shown in FIG. 3c, where the contact face 30 on the side remote from the chip 31 lies flush with the main wall 24. In other words, the contact face 30 is located so as to be flush with the main face 17 of the card body that is being made.

Penetration of electronic module 3 into the thermoplastic material filling recess 23 must occur before the molten material has solidified. Thus, the start and finish times for movement of actuator 28 are controlled so that the electronic module 3 is introduced into recess 23 only after at least most of recess 23 has been filled and position 28' is reached before the molten material has solidified. This has several advantages. Firstly, electronic module 3 may be so fragile that it could be damaged by the flow of material into recess 23 due to the temperature of the molten material, forces due to the flow rate under the injection pressure, or both. Therefore, by waiting until after the recess 23 is at least substantially filled, forces due to flow rate are minimal, and the temperature may have dropped somewhat due to exposure to the colder mold and due to the time lapse since the material exited from the source. Thus, prevention of damage to the electronic module 3 is one advantage. Secondly, if the electronic module 3 were to be inside recess 23 while the molten material is flowing into it, the module might interfere with proper flow and cause malformation of card body 12. By keeping the module 3 out of recess 23, the thermoplastic material flows with no obstructions and, therefore, forms card body 12 properly.

Although the above-described preferred approach has its advantages, the sequential operation of the filling step and the module positioning step takes more time than if these steps were performed simultaneously or, at least, if they overlap in time. Thus, the time factor makes it useful to introduce electronic module 3 into recess 23 as much as possible before recess 23 is filled. This is possible for rugged modules that will not be damaged by exposure to the flowing material. It is also possible for certain shapes of modules as related to the shape and volume of the mold in that proper formation of card body 12 is not hampered by undue interference to flow. Other factors that affect whether or not this approach can be adopted are the viscosity of the thermoplastic material and its temperature. In fact, it is even possible under proper conditions to introduce electronic module 3 into recess 23 before injection is triggered so that at least substantially the entire filling operation is carried out with the module positioned within recess 23. It is deemed obvious to one with ordinary skill in the art how to set the optimum time for positioning electronic module 3 within recess 23 in relation to the operation of injecting thereinto the thermoplastic material, particularly based on the above-described is considerations.

It should also be observed that the cavity 26 is disposed in the moving portion 22 of the mold, at the side of recess 23 remote from the injection chamber 35, as seen in the plane of the card body. This provides the advantage of a wider range of time during which the electronic module can be moved into the recess 23. Having the material injection orifice 36 disposed remotely from the electronic module 3 serves, firstly, to enable the material to enter recess 23 of the mold 20 and fill it without being significantly disturbed by the module and, secondly, makes it possible to cause the flow rate and the pressure of the thermoplastic material at the position 28' where the module 3 is installed to be much lower than the flow rate and pressure in the vicinity of the injection orifice 36, thus reducing the possibility of damaging the module.

Once the molding operation has been completed, the suction applied to the main suction duct 34 within the piston 28 is interrupted, and the moving portion 22 of the mold is moved away from the fixed portion 21. Thereafter the card is unmolded and printed by offset printing, silk-screen printing, stamping, or photogravure on the main face 17, with the main face 18 optionally having inscriptions engraved in the plate 41 appearing thereon as projections or indentations.

As shown in FIG. 1a, it will be observed that the entire surface of the main face 17 in which the electrical contacts 14 are flush can be printed, i.e. including the contact face 30 but with the exception of the electrical contacts 14 themselves.

In general, the thermoplastic material constituting the card body 12 will be tinted using pigments, and preferably white pigments. However it is also possible to leave the material in a transparent state and to print only one of the main faces of the card, the graphic then being seen from the other face by transparency.

The use of certain specific materials makes it possible to achieve a bond between the card body 12 and the electronic module 3 which is comparable to heat sealing. More particularly, the method of the invention as described above, and using such specific materials, enables intermolecular chemical bonds to be created between the materials constituting the card body and the support film for the electronic module. This is most advantageous since the mechanical connection between the card body 12 and the module 3 is reinforced by the intermolecular bonds, thus improving the reliability and the mechanical strength of the resulting memory card.

By way of example, the card body may be made of polyester, polycarbonate, an alloy of polyester and polycarbonate, or acrylonitrile-butadene-styrene (ABS), while the support for the electronic module can be made of polycarbonate, an alloy of liquid crystal polymers (LCP) and of polycarbonate, polyamide, butylene polyterephthalate, or even also ABS if the card body is itself made of ABS.

Figure 4:
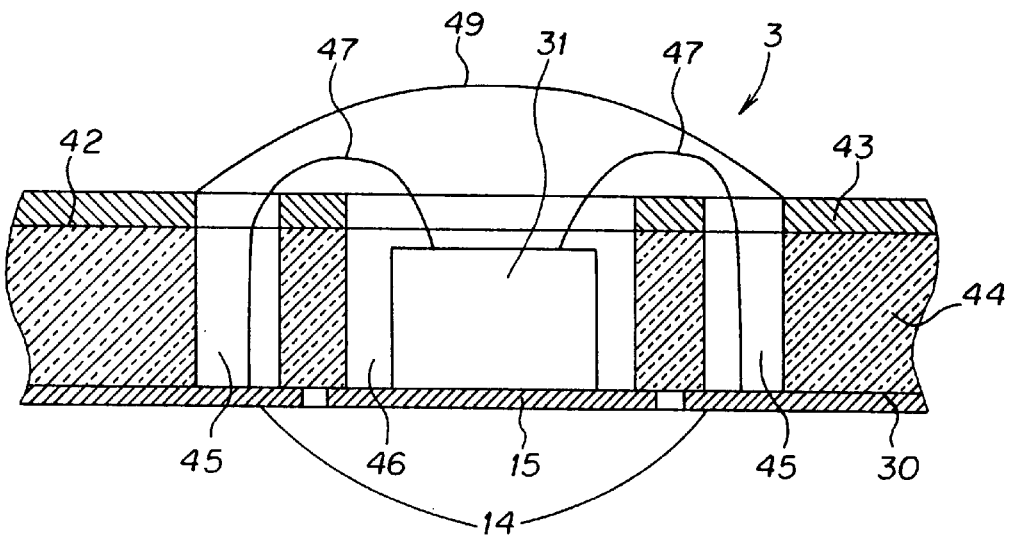
FIG. 4 is a cross-section view of an electronics module prepared for implementing the method of the invention.

FIG. 4 shows an electronic module 3 constituted by a film support 44 through which there are formed by silk-screen printing not only a window 46 for receiving the semiconductor chip 31 together with perforations 45 for passing metal connection wires 47 connecting said chip 31 to silk-screen printed electrical contacts 14, but also a metal area 15 on the contact face 30 of the support 44. The semiconductor chip 31 and the connection wires 47 are mechanically and chemically protected by a drop 49 of thermosetting resin.

It can happen that the material constituting the support of the electronic module is a thermosetting material such as a polyimide, or contains a thermosetting material, such as a glass fiber cloth impregnated with epoxy resin. Under all such circumstances, it is not possible for intermolecular bonds to be created during molding between the card body and the electronic module, and this can give rise to a risk of the molecule coming unstuck if it is does not adhere sufficiently to the card body.

To remedy this difficulty, the support 44 of the electronic module 3 is covered on a face 42 remote from the contact face 30 with a layer 43 of hot melt resin such as polyamide or polyolefin-based resins and suitable, during molding, for creating intermolecular bonds with the thermoplastic material of the card body 12 under the temperature and pressure conditions that obtain while the mold recess is being filled.

In practice, the hot melt resin may be deposited directly as a continuous strip 43 by rolling on the face 42 of the support 44, with the strip 43 of hot melt resin being previously perforated so as to avoid covering the window 46 of the semiconductor chip 31 or the holes 45 through which the metal wires 47 pass.

Figure 5:
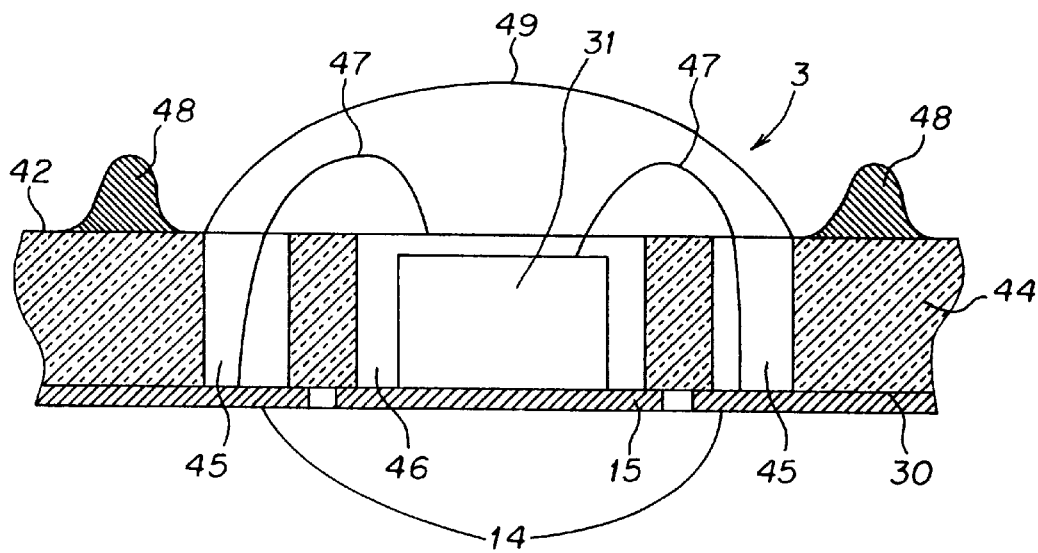
FIG. 5 is a cross-section view of a variant of the electronics module of FIG. 4.

Instead of strip 43, another embodiment shown in FIG. 5 utilizes calibrated volume drops 48 of the hot melt resin deposited on the face 42 of the support 44.

Thus, printing is performed on a completed memory card, i.e. a card having an electronic module integrated in the body of the card itself. It will be understood that since the module is present when printing takes place, the problem associated with the fragility of the bottom of the cavity is eliminated specifically by the absence of any such cavity. This makes printing much simpler since there is no longer any need to provide means for supporting the bottom of the cavity, as is required in known methods.

Further, the method of the invention makes it possible, firstly, to obtain a position for the electronic module relative to the three axes of the card that is accurately defined and reproducible and, secondly, it makes it possible to obtain a module contact face plane that presents no discontinuity with the card body. These two advantages make it possible to print the graphic on both main faces of the complete memory card without compromising manufacturing costs by excessively high reject rates due to bad printing.

As a result, it is possible for the card manufacturer to store completed cards that are blank of any graphic, and to respond very quickly and at any moment to the needs of operators/clients. It is even possible to deliver blank cards without a graphic, and for the cards to be printed on the premises of the client or of a subcontractor. Thus, it is no longer necessary to maintain an inventory of printed cards into which the electronic module is installed because, with the present invention, the printing is done only after module installation is completed.

Finally, because there is no discontinuity between the contact face of the electronic module and the card body, the invention makes it possible for the graphic to be printed on the main face of the card body that is flush with the electrical contacts, including on the contact face of the electronic module, but with the exception of the electrical contacts themselves. The number, area, and positions of the contacts are defined by the ISO 7810 standard, and allowance can therefore be made for them when the graphic is created. This advantage provides a considerable improvement in card appearance.

It is understood that the specific embodiments described in detail herein are by way of example, and that various modifications thereto can be readily made by one with ordinary skill in the art. All such modifications are intended to fall within the scope of the invention as defined by the following claims.

What is claimed is:

1. A method of printing a graphic on an electronic memory card comprised of a card body, made of a thermoplastic material and having two main faces that are substantially mutually parallel, and an electronic module carrying electrical contacts on a contact face thereof, which contacts are connected to a semiconductor chip, the method comprising the sequential steps of:

first, molding the electronic memory card by injecting the thermoplastic material in a molten state into a mold having a cavity defining the shape of the card body, and solidifying the molten material in the presence of the electronic module in the mold;

then, unmolding the electronic memory card; and finally, printing the graphic on the card body;

wherein said electronic module is put into place inside said cavity after injection and before solidification of said molten thermoplastic material, in such a manner that after solidification and unmolding, said electrical contacts are substantially flush with one of the main surfaces of the card body.

2. A method according to claim 1, wherein said module is put into place inside said cavity after the injected thermoplastic material has at least substantially completely filled said cavity.

3. A method according to claim 1, wherein said module is introduced into said cavity, for later being put into place, only after the injected thermoplastic material has at least substantially completely filled said cavity.

4. A method according to claim 3, wherein said module is moved to its position where said electrical contacts are substantially flush with one of the main surfaces of the card body before the injected thermoplastic material in a molten state has solidified.

5. A method according to claim 1, wherein said thermoplastic material is injected into said cavity at a point remote from said module.

* * * * *